(12) United States Patent
Park (10) Patent No.: US 7,394,446 B2
(45) Date of Patent: Jul. 1, 2008

(54) ORGANIC ELECTROLUMINESCENCE DEVICE

(75) Inventor: Jae Yong Park, Gyeonggi-do (KR)

(73) Assignee: LG.Philips LD Co., Ltd., Seoul (KR)

( * ) Notice: Subject to any disclaimer, the term of this patent is extended or adjusted under 35 U.S.C. 154(b) by 114 days.

(21) Appl. No.: 11/019,574

(22) Filed: Dec. 23, 2004

(65) Prior Publication Data

US 2005/0140306 A1 Jun. 30, 2005

(30) Foreign Application Priority Data

Dec. 26, 2003 (KR) ...................... 10-2003-0097118

(51) Int. Cl.
*G09G 3/36* (2006.01)
(52) U.S. Cl. .............................. 345/92; 345/91; 345/90; 345/82; 345/76
(58) Field of Classification Search ................... 345/92, 345/91, 82, 80, 76, 77, 55, 206, 211, 212; 315/169.3, 169.4
See application file for complete search history.

(56) References Cited

U.S. PATENT DOCUMENTS

2005/0140287 A1* 6/2005 Ko .............................. 313/506

FOREIGN PATENT DOCUMENTS

| JP | 4-31299 | 3/1992 |
|---|---|---|
| JP | 11-003048 | 1/1999 |
| JP | 2001-100654 | 4/2001 |
| JP | 2002-318555 | 10/2002 |
| JP | 2003-257667 | 9/2003 |
| KR | 2003-57547 | 8/2003 |

* cited by examiner

*Primary Examiner*—Tuyet Vo
(74) *Attorney, Agent, or Firm*—Morgan, Lewis & Bockius LLP (57) ABSTRACT

An organic electroluminescence device includes: first and second substrates spaced apart from each other by a predetermined distance; a plurality of array elements having TFTs formed on the first substrate; organic electroluminescent diodes each having a first electrode acting as a common electrode, an organic electroluminescent layer formed under the first electrode, and a second electrode patterned for a sub-pixel, which are sequentially formed on the second substrate; and conductive spacers for electrically connecting the array elements and corresponding organic electroluminescent diodes, wherein the array elements are arranged on the first substrate in a matrix configuration, and power lines for supplying voltages to the array elements are formed in a mesh configuration.

19 Claims, 6 Drawing Sheets

ORGANIC ELECTROLUMINESCENCE DEVICE

The present invention claims the benefit of Korean Patent Application No. 2003-0097118 filed in Korea on Dec. 26, 2003, which is hereby incorporated by reference.

BACKGROUND OF THE INVENTION

1. Field of the Invention

The present invention relates to a light emitting device, and more particularly, to an organic electroluminescence device.

2. Description of the Related Art

Among flat panel displays, an organic electroluminescence device (ELD) is a self-emission type display that has a high contrast and a wide viewing angle. The organic ELD can be made to be lightweight and have a slim profile as compared to other displays because it does not require a backlight. An organic electroluminescence device also uses less power than other types of flat panel displays. Further, the organic ELD can be driven with a low DC voltage and still have a rapid response time. Since all of the components of the organic ELD are formed of solid materials, it can withstand an impact. The organic ELD can operate throughout a wide temperature range and be manufactured at a low cost.

Unlike fabricating an LCD or a PDP, the organic ELD is manufactured by just using a deposition process and an encapsulation process. Thus, the manufacturing processes and apparatuses for making an organic ELD are very simple.

A passive matrix type organic ELD that does not have a switching element to drive the organic ELD has been widely used. In the case of the passive matrix type, gate lines (scan lines) cross data lines (signal lines) to define a matrix of sub-pixels. The gate lines are sequentially driven to drive each sub-pixel. In order to exhibit a required mean luminescence, a higher level of instantaneous luminance must be emitted sequentially in each sub-pixel across the display to create an overall average luminance.

In the case of an active matrix type, thin film transistors acting as switching elements are located in respective sub-pixels. First electrodes are connected to the thin film transistors, which are turned on/off by a sub-pixel unit. A second electrode facing the first electrodes is a common electrode.

The voltage applied to the sub-pixels charges a storage capacitor Cst so that the voltage can be applied until a next frame signal is applied, thereby continuously driving the organic ELD during one frame regardless of the number of gate lines. Accordingly, in the case of the active matrix type, even when low current is applied, uniform luminescence can be obtained. As a result, the organic ELD has the advantages of low power consumption, high definition and large-sized screen capability. Such an active matrix type organic electroluminescence device will now be described with reference to the accompanying drawing.

Figure 1:
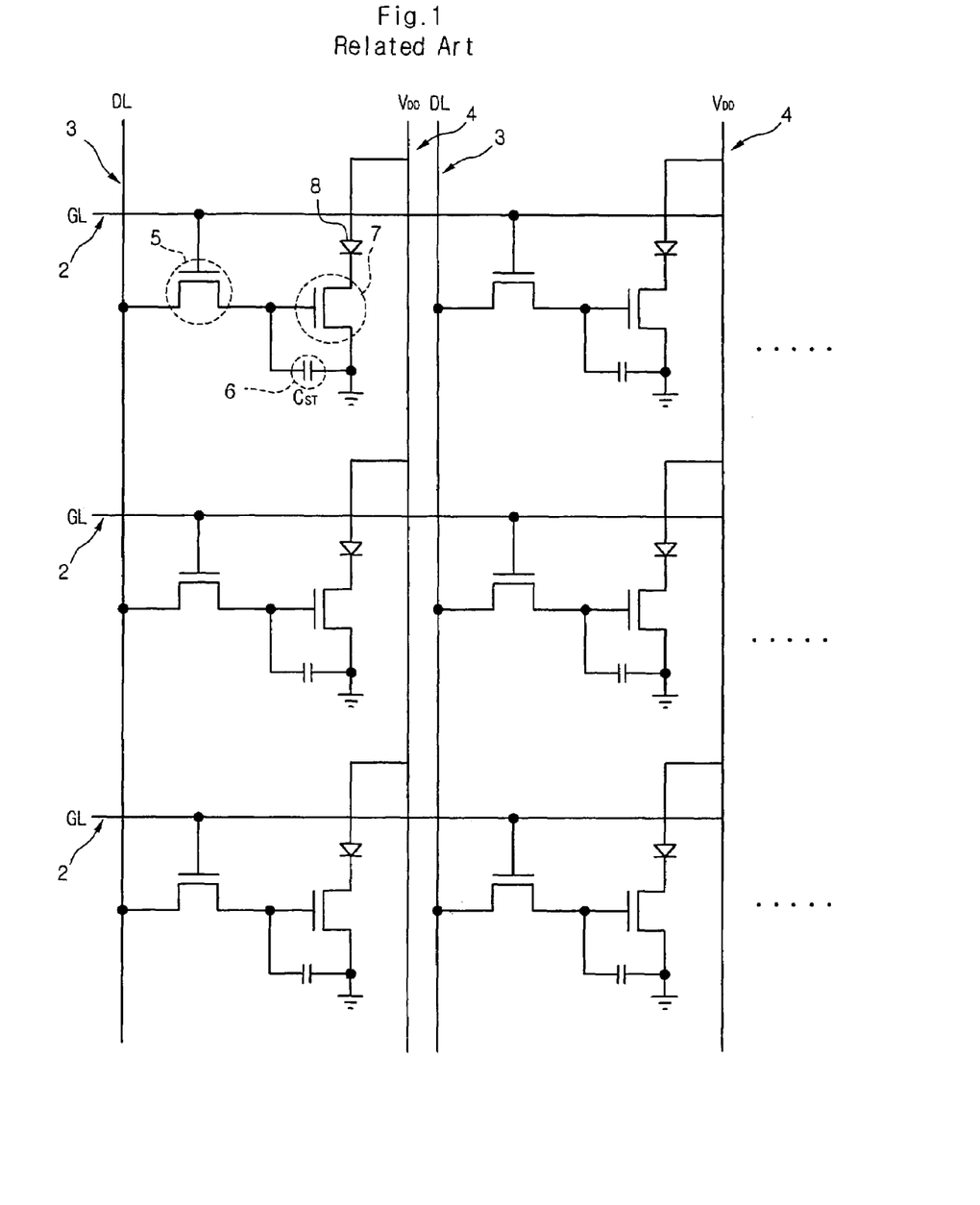
FIG. 1 is a circuit diagram of a basic sub-pixel structure of a related art active matrix type organic electroluminescence device.

FIG. 1 shows a circuit diagram illustrating a basic sub-pixel structure of a related art active matrix type organic electroluminescence device. As shown in FIG. 1, gate lines (GL) 2 are formed in a first direction. Further, data lines (DL) 3 and power lines VDD 4 are formed in a second direction crossing the first direction to define a sub-pixel region. A switching TFT 5 is formed adjacent to a crossing of a gate line 2 and a data line 3. A storage capacitor $C_{ST}$ 6 is connected to the switching TFT 5 and the power line 4. A driving TFT 7 connected to a current source element is connected to the storage capacitor $C_{ST}$ 6 and the power line 4.

An organic electroluminescent diode 8 is connected to the driving TFT 7. When current is applied to the organic light emitting material in a forward direction, electrons and holes are recombined, moving through a P-N junction between an anode electrode as a hole donor and a cathode electrode as an electron donor. The energy of the organic electroluminescent diode 8 becomes lower than that created when the electrons are separated from the holes. This energy difference creates an emission of light. The organic electroluminescence device may be classified into a top emission type and a bottom emission type depending on which direction light is emitted from the organic electroluminescent diode.

Figure 2:
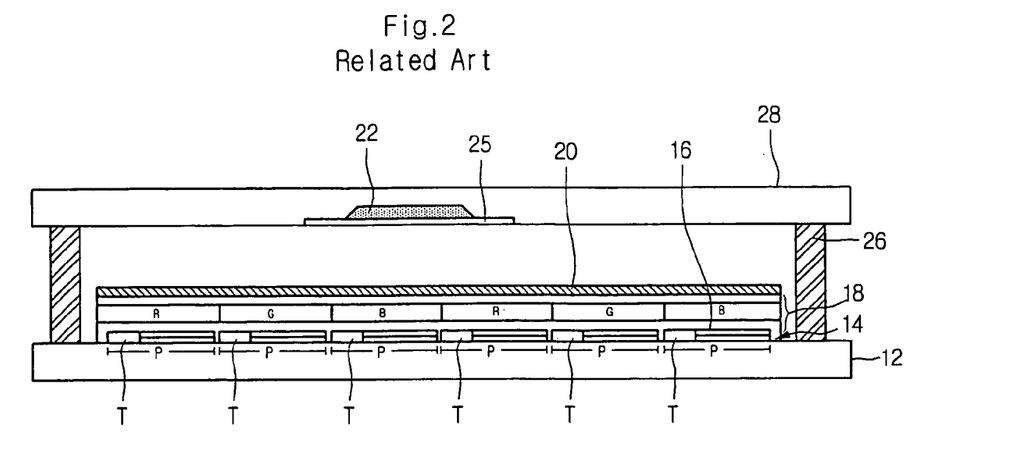
FIG. 2 is a cross-sectional view of the related art bottom emission type organic electroluminescence device.

FIG. 2 is a cross-sectional view of the related art bottom emission type organic electroluminescence device. As shown in FIG. 2, an organic electroluminescence device 10 includes a transparent first substrate 12, a TFT array 14 formed on the first substrate 12, a first electrode 16 formed over the TFT array 14, an organic luminescent layer 18 over the first electrode 16 and a second electrode 20 formed on the organic luminescent layer 18. The organic luminescent layer 18 reproduces red R, green G and blue B colors. For example, organic materials emitting R, G and B colors can be patterned in each sub-pixel P.

An absorbent material 22 is used to remove moisture and oxygen that may damage the organic electroluminescence device. A portion of the substrate 28 is etched and the absorbent material 22 is filled in the etched portion and fixed by a tape. The first substrate 12 is then adhered to the second substrate 28 by a sealant 26, thereby encapsulating the organic electroluminescence device.

Figure 3:
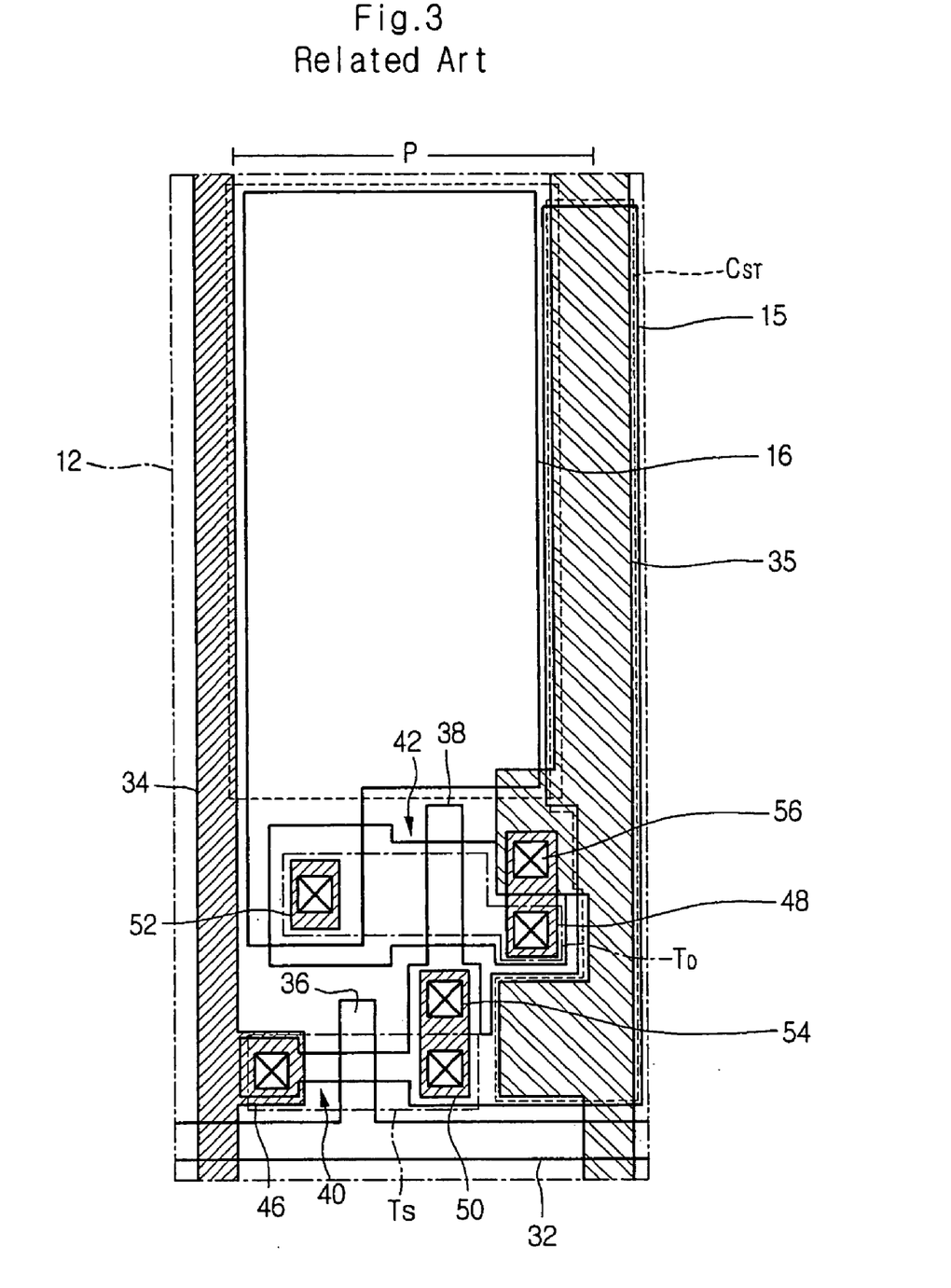
FIG. 3 is a plan view illustrating a sub-pixel of a TFT array included in the related art organic electroluminescence device depicted in FIG. 2.

FIG. 3 shows a sub-pixel of a TFT array included in the related art organic electroluminescence devices depicted in FIG. 2. In the case of the active matrix type organic electroluminescence device, each of the sub-pixels of the TFT array formed on the substrate is provided with a switching element $T_S$, a driving element $T_D$ and a storage capacitor CST. Depending upon desired operation characteristics, the switching or driving transistors can be formed of a combination of more than one TFT. The substrate is formed of a transparent insulating material, such as glass or plastic.

As shown in FIG. 3, gate lines 32 and data lines 34 are provided in which the data lines 34 cross the gate lines 32. An insulating layer is formed between the gate lines 32 and the data lines 34. In addition, power lines 35 are formed in parallel with the data lines 34.

The switching TFT $T_S$ includes a gate electrode 36, an active layer 40, a source electrode 46, and a drain electrode 50. The driving TFT $T_D$ includes a gate electrode 38, an active layer 42, a source electrode 48, and a drain electrode 52. The gate electrode 36 of the switching TFT $T_S$ is connected to the gate line 32 and the source electrode 46 connected to the data line 34. The drain electrode 50 is connected to the gate electrode 38 of the driving TFT $T_D$ through a contact hole 54. The source electrode 48 of the driving TFT $T_D$ is connected to the power line 35 through a contact hole 56. Also, the drain electrode 52 is connected to the first electrode 16 formed on the pixel P.

In the related art bottom emission type organic electro luminescence device, the first substrate 12 on which the array element and the organic electroluminescent diode are formed is adhered to the separate second substrate 28 for encapsulation. In this case, the yield of the organic electroluminescence device is determined by multiplying the yield of the array element by the yield of the organic electroluminescent diode. Therefore, in the related art organic electroluminescence device, the entire process yield is greatly limited to a latter process, that is, the process of forming an organic electroluminescent diode. For example, even though the array element is formed excellently, if defects occur due to foreign matters or other factors in forming the organic electroluminescent layer using a thin film of about 1000 Å thick, the entire organic electroluminescence device is rendered defective.

A defective organic electroluminescent layer results in the loss of every expense and material cost spent in manufacturing the non-defective array element. The bottom emission type has high stability and high degree of freedom due to the encapsulation but has limitation in aperture ratio so that it is not applicable to high definition products. Further, when the voltage drop is small at the power line (4 in FIG. 1, 35 in FIG. 3) through which the voltage is supplied to each sub-pixel, the organic electroluminescence device can uniformly maintain the picture quality of the panel. However, in the case of the related art device shown in FIG. 3, there is a limit to the line width and thickness of the power line. Therefore, a voltage difference (voltage drop) occurs between the sub-pixels connected to the power line of the first stage and the sub-pixels connected to the power line of the last stage, such that a uniform picture quality cannot be obtained.

SUMMARY OF THE INVENTION

Accordingly, the present invention is directed to an organic electroluminescence device that substantially obviates one or more problems due to limitations and disadvantages of the related art.

An object of the present invention is to provide an organic electroluminescence device that does not have a voltage drop along the power lines.

Additional advantages, objects, and features of the invention will be set forth in part in the description which follows and in part will become apparent to those having ordinary skill in the art upon examination of the following or may be learned from practice of the invention. The objective and other advantages of the invention may be realized and attained by the structure particularly pointed out in the written description and claims hereof as well as the appended drawings.

To achieve these objectives and other advantages and in accordance with the purpose of the invention, as embodied and broadly described herein, there is provided an organic electroluminescence device, including: first and second substrates spaced apart from each other by a predetermined distance; a plurality of array elements having TFTs formed on the first substrate; organic electroluminescent diodes each having a first electrode acting as a common electrode, an organic electroluminescent layer formed under the first electrode, and a second electrode patterned for a sub-pixel, which are sequentially formed on the second substrate; and conductive spacers for electrically connecting the array elements and corresponding organic electroluminescent diodes, wherein the array elements are arranged on the first substrate in a matrix configuration, and power lines for supplying voltages to the array elements are formed in a mesh configuration.

In another aspect of the present invention, there is provided an organic electroluminescence device, including: a first substrate having a plurality of array elements formed in a matrix configuration at regions defined by gate lines and data lines, the gate lines being arranged in a first direction, the data lines being arranged in a second direction crossing the first direction; a second substrate on which organic electroluminescent diodes having organic electroluminescent layers are formed; and a conductive spacer for electrically connecting the array elements and the corresponding organic electroluminescent diodes, wherein a first power line is arranged in parallel with the data lines and spaced apart from one of the data lines by a predetermined distance, and a second power line is arranged in parallel with the gate lines and spaced apart from one of the gate lines, the second power line intersecting the first power line.

In another aspect of the present invention, there is provided a method of making an organic electroluminescence device, including: forming a plurality of array elements on a first substrate in a matrix configuration defined by gate lines and data lines, the gate lines being arranged in a first direction, the data lines being arranged in a second direction intersecting with the first direction; forming a first power line on the first substrate in parallel with the data lines and spaced apart from one of the data lines by a predetermined distance, and a second power line on the first substrate in parallel with the gate lines and spaced apart from one of the gate lines, the second power line intersecting with the first power line; forming organic electroluminescent diodes on a second substrate; and providing a conductive spacer for electrically connecting the array elements and the corresponding organic electroluminescent diodes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment (s) of the invention and together with the description serve to explain the principle of the invention.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 4:
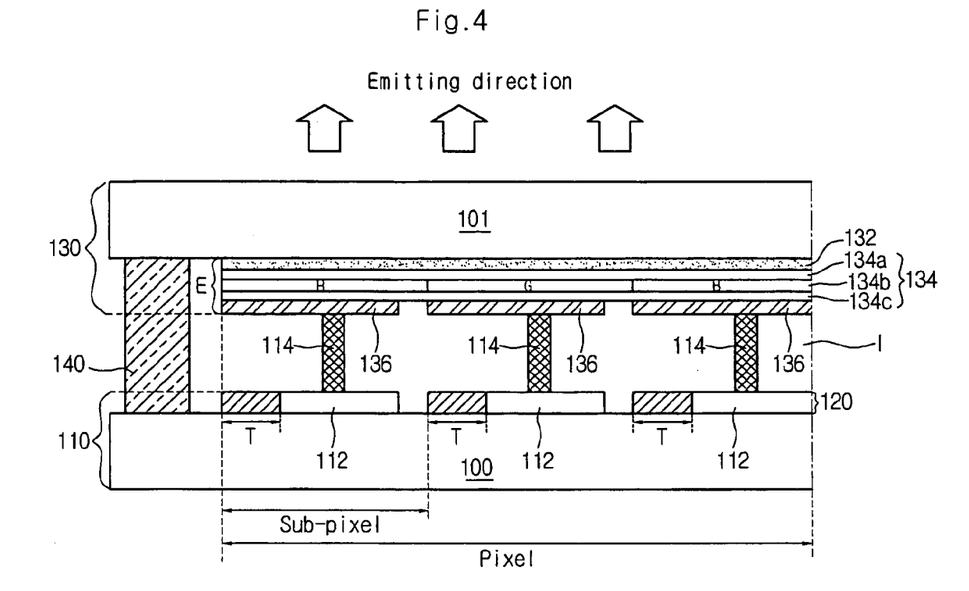
FIG. 4 is a cross-sectional view of a dual panel type organic electroluminescence device according to an embodiment of the present invention.

FIG. 4 is a cross-sectional view of a dual panel type organic electroluminescence device according to an embodiment of the present invention. For the convenience of the description, only one sub-pixel region is illustrated and shown in FIG. 4.

Referring to FIG. 4, first and second substrates 110 and 130 are arranged facing each other. An array element 120 is formed on a transparent substrate 100 of the first substrate 110. An organic electroluminescent diode E is formed on a lower portion of a transparent substrate 101 of the second substrate 130. Edges of the first and second substrates 110 and 130 are encapsulated by a seal pattern 140.

The organic electroluminescent diode E includes a first electrode 132 used as a common electrode, an organic electroluminescent layer 134 formed under the first electrode 132, and a second electrode 136 formed under the organic electroluminescent layer 134. The organic electroluminescent layer 134 includes a light emission layer 134b on which emission material having red, green and blue colors are patterned for each sub-pixel, a first organic material layer 134a formed on a top of the emission layer 134b, and a second organic material layer 134a formed on a bottom of the emission layer 134c.

The organic electroluminescence material of the first and second organic material layers 134a and 134b is determined according to an arrangement of anode and cathode electrodes. For example, when the first electrode 132 is the anode electrode and the second electrode 136 is the cathode electrode, the first organic material layer 134a includes a hole injection layer and a hole transport layer and the second organic material layer 134c includes an electron injection layer and an electron transport layer.

The array element 120 includes TFTs T and second electrode connecting patterns 112 connected to the TFTs T. The TFTs t are formed in each sub-pixel. The second electrode connecting patterns 112 extend from source or drain electrodes of the TFTs T. Alternatively, the second electrode connecting patterns 112 may be formed by patterning a separate metal material.

Each TFT T is a driving TFT connected to the organic electroluminescent diode E. Conductive spacers 114 connecting the second electrode 136 to the TFT T in a direction parallel to the seal pattern 140 are formed in a section between the second electrode 136 and the second electrode connecting pattern 112. The conductive spacers 114 are formed of conductive material, preferably malleable metal material having low resistance. Such conductive spacers 114 may be formed in a process of forming the array element 120 of the first substrate 110.

According to an embodiment of the present invention, the organic electroluminescence device is a top emission type that emits light emitted from the organic electroluminescent layer 134 toward the second substrate 130. If the first electrode 132 is used as the anode electrode, the first electrode 132 is formed of transparent conductive material while the second electrode 136 is formed of opaque metal material to prevent constructive interference caused by light reflection emitted downward. If the first electrode 132 is used as the cathode electrode, the first electrode 132 is formed of transparent or semitransparent conductive material. For example, the first electrode 132 is formed of a metal material having a low work function.

When the first electrode 132 is used as the cathode electrode, it is preferable that the material layer of the first electrode 132 be formed of a semitransparent metal material having a low work function. In addition, it is preferable that the semitransparent metal material be selected from the group consisting of Al, an alloy of Al and Mg (hereinafter, referred to as Mg:Al), and Al:Li, Al:benzonate. In both cases, the second electrode 136 is formed of opaque metal material to prevent constructive interference caused by light reflection emitted downward. In addition, it is preferable that a gap I between the first and second substrates 110 and 130 be formed in a nitrogen atmosphere.

In the above described dual panel type organic electroluminescence device, since the array element and the organic electroluminescent diode are formed on different substrates from each other, the yield of the array element does not affect the yield of the organic electroluminescent diode or vice versa, the production yield for each element can be individually managed.

Since the TFTs can be designed without considering the aperture rate, processing efficiency of the array element can be improved so that a large-sized display can be easily produced. Because the device is formed as a dual panel type, the infiltration of external air can be effectively prevented, thereby improving the reliability of the product. Further, the degree of freedom of the first electrode can be improved as compared to the related art where the first electrode is formed on the array element.

Although not shown, the array element 120 is formed in a matrix configuration in the array region of the first substrate 110. The array element 120 includes a gate line, a data line, a power line, a switching transistor and a storage capacitor. The data line and the power line are spaced apart by a predetermined distance and cross the gate line. The switching TFT disposed adjacent to the crossing of the gate line and the data line.

According to embodiments of the present invention, the power line is formed in a mesh configuration on the array region on which the array element is formed in the matrix configuration. Due to such the mesh configuration, voltage drop along the power line can be prevented, thereby improving the uniformity of the entire picture quality on the panel.

Figure 5:
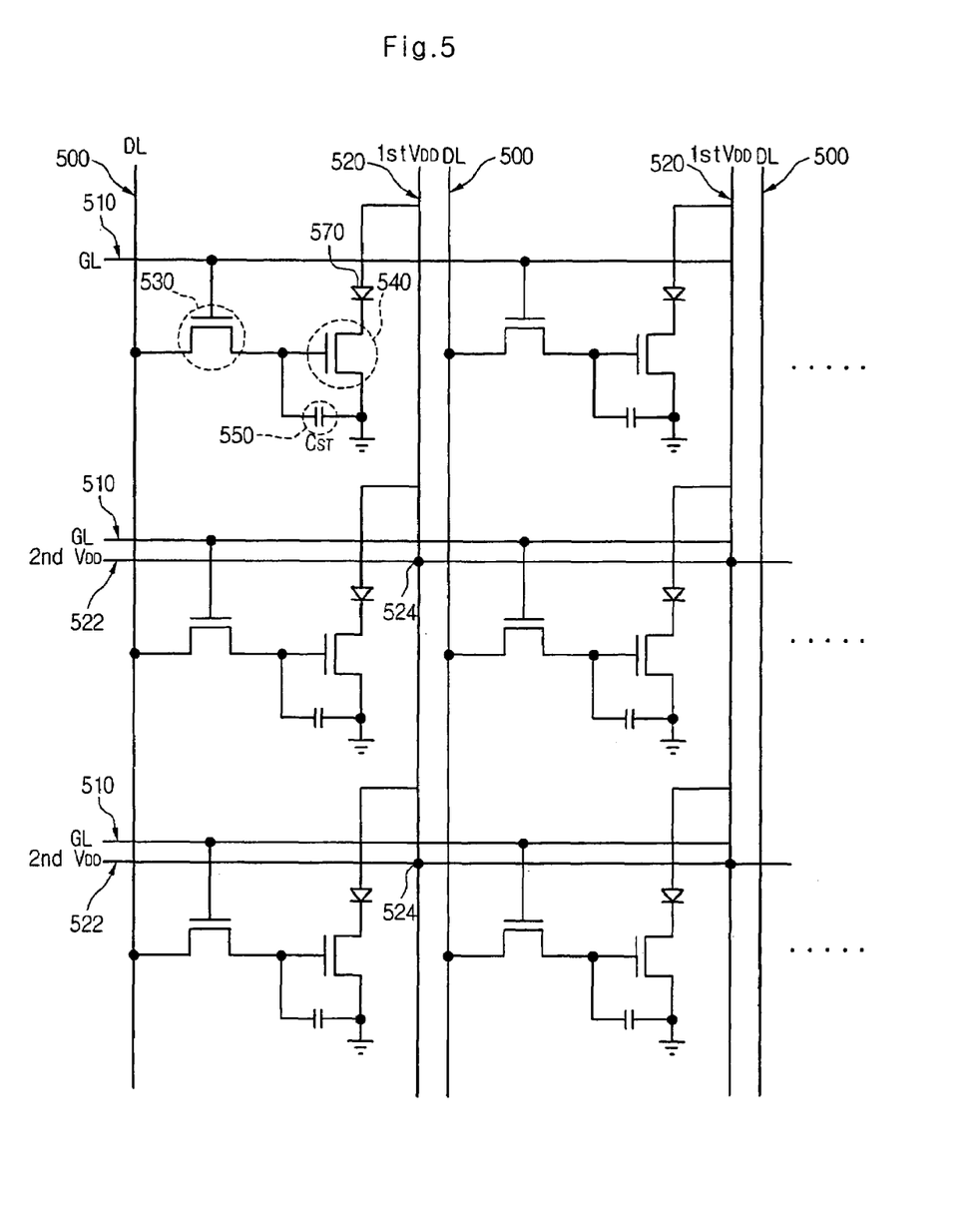
FIG. 5 is a circuit diagram of a basic sub-pixel structure of the organic electroluminescence device depicted in FIG. 4.

FIG. 5 is a circuit diagram of a basic sub-pixel structure of the organic electroluminescence device shown in FIG. 4. Referring to FIG. 5, the power lines VDD 520 are arranged in a direction parallel to the data lines 500 and the power lines VDD 522 are arranged in a direction parallel to the gate lines 510. All of the power lines VDD 520 intersect power lines VDD 522 and are connected at their intersections. More specifically, the first power lines 520 and the second power lines 522 are electrically connected together through the contact holes 524, which are formed at their intersections, that is, at the overlapped portions. Consequently, a mesh configuration is formed on the array region.

By forming the power lines in the mesh configuration, the entire area of the power line is widened, thereby reducing the entire resistance. Thus, voltage drop along the power lines can be prevented. The second power lines 522 may be formed of the same metal material and in the same layer as the gate lines 510. The first power lines 520 and/or second power lines 522 may be formed of Cu so as to further prevent voltage drop along the power lines.

In the basic sub-pixel structure of the organic electroluminescence device according to embodiments of the present invention, the gate lines 510 and the second power lines 522 are formed in a first direction, and the data lines 500 and the first power lines 520 are formed spaced apart from one another and are formed in a second direction crossing the first direction, thereby defining one sub-pixel region. The gate lines 510 and the second power lines 522 are spaced apart from one another by a predetermined distance. The first power lines 520 and the second power lines 522 are electrically connected through the contact holes 524 where the lines overlap.

The switching TFTs 530 act as addressing elements and are formed at the crossings of the gate lines 510 and the data lines 500. The storage capacitors ($C_{ST}$) 550 are formed between the switching TFTs 530 and the first power lines 520. The driving TFTs 540 act as current source elements, and are formed between the storage capacitors ($C_{ST}$) 550 and the first power lines 520. The electroluminescent diodes 570 are formed between the first power lines 520 and the driving TFTs 540.

Since the organic electroluminescence device shown in FIG. 4 is the dual panel type, the organic electroluminescent diodes 570 are formed on the second substrate (130 in FIG. 4), that is, on the upper substrate.

Figure 6:
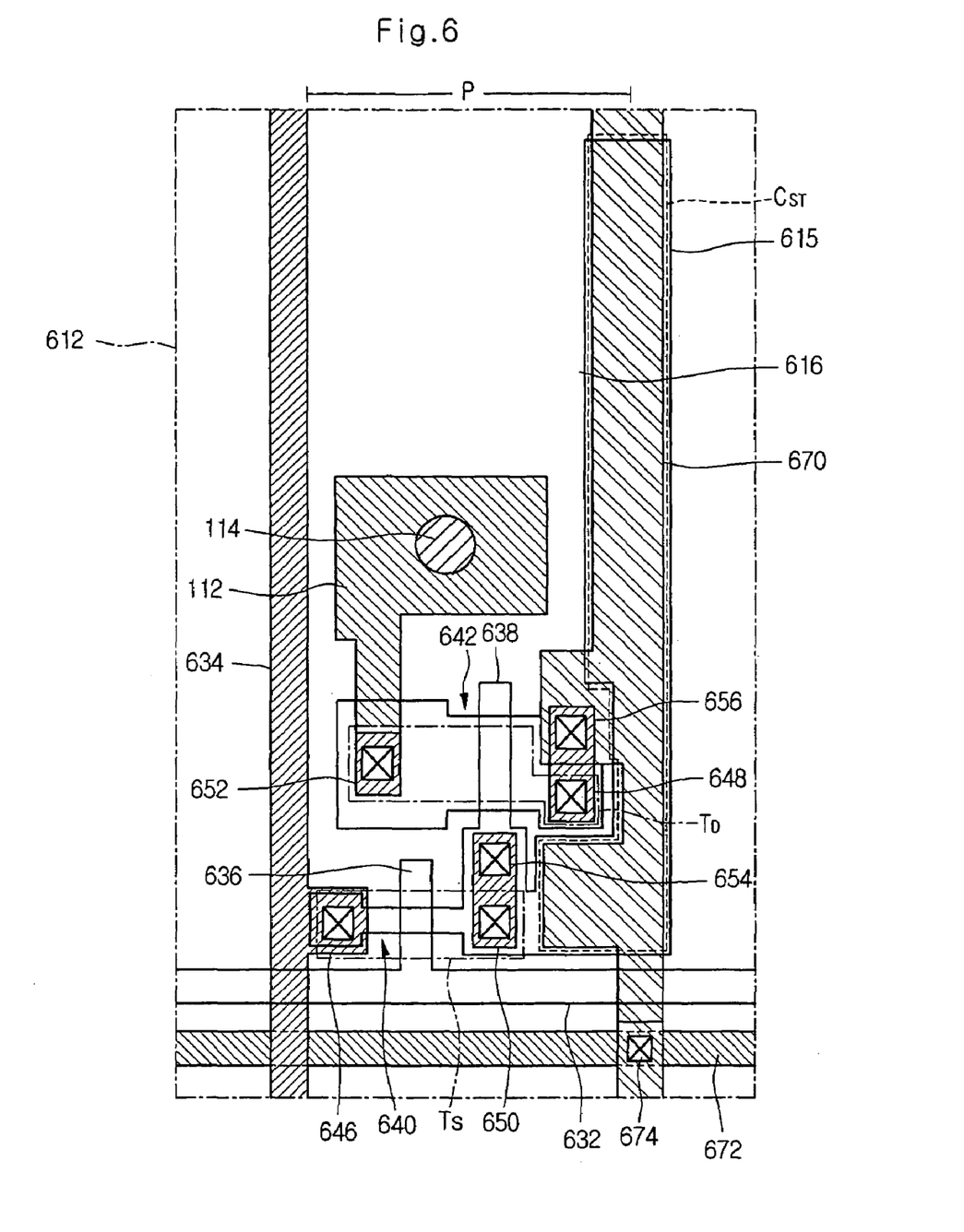
FIG. 6 is a plan view illustrating a sub-pixel array element of a TFT array included in the organic electroluminescence device depicted in FIG. 4.

FIG. 6 is a plan view of one sub-pixel of the TFT array included in the organic electroluminescence device depicted in FIG. 4. Although a TFT having a top gate structure is shown in FIG. 6, embodiments of the present invention can include bottom gate type TFTs. In the dual panel type organic electroluminescence device according to embodiments of the present invention, the organic electroluminescent diodes E are formed on the second substrate (130 in FIG. 4), and the array elements (120 in FIG. 4) corresponding to the organic electroluminescent diodes E are formed on the first substrate (110 in FIG. 4). The array elements (120 in FIG. 4) and the organic electroluminescent diodes E are electrically connected by the conductive spacers 114.

FIG. 6 illustrates a plan view of sub-pixel array elements formed on the first substrate 110 shown in FIG. 4, in which the TFT TD is connected to the second electrode connecting pattern 112. The sub-pixel array elements corresponding to the organic electroluminescent diode include the switching element Ts, the driving element $T_D$ and the storage capacitor $C_{ST}$. Depending upon desired operational characteristics, the switching or driving element can be formed of a combination of more than one TFT.

Each of the sub-pixel array elements formed on the first substrate corresponds to the organic electroluminescent diodes E including the first electrode (132 in FIG. 4), the organic electroluminescent layer (134 in FIG. 4) and the second electrode (136 in FIG. 4), which are formed on the second substrate, that is, the upper substrate. On the first substrate, the second electrode connecting patterns 112 connected to the second electrodes of the upper substrate are formed at the sub-pixel array element regions. In addition, the second electrodes 136 of the second substrate are electrically connected to the second electrode connecting patterns 112 by the conductive spacers 114 formed therebetween.

The array element includes gate lines 632 spaced apart from one another by a predetermined distance in one direction, and data lines 634 crossing the gate lines 632 with an insulating layer interposed therebetween. In addition, the second power lines 672 are formed in parallel with the gate lines 632, and the first power lines 670 are formed in parallel with the data lines 634. The first power lines 670 and the second power lines 672 are electrically connected together through the contact holes 674 formed at the intersections thereof.

The power lines are formed in a mesh configuration in which the first power lines 670 and the second power lines 672 intersect with one another. Due to such a mesh structure, the entire area of the power lines are widened, thereby reducing the resistance of the power lines. In this manner, the voltage drop along the power line can be prevented. It is preferable that the first power lines 670 and the second power lines 672 be formed of metal material having low resistance, for example, Cu. Also, the first power lines 670 and the second power lines 672 may be formed of the same metal material as the data lines 634 and the gate lines 632.

The switching TFT $T_S$ includes a gate electrode 636, an active layer 640, a source electrode 646 and a drain electrode 650. The driving TFT $T_D$ includes a gate electrode 638, an active layer 642, a source electrode 648 and a drain electrode 652. The gate electrode 636 of the switching TFT Ts is connected to the gate line 632 and the source electrode 646 connected to the data line 634. The drain electrode 650 of the switching TFT $T_S$ is connected to the gate electrode 638 of the driving TFT $T_D$ through a contact hole 654. The source electrode 648 of the driving TFT $T_D$ is connected to the first power line 670 through a contact hole 656. The drain electrode 652 of the driving TFT $T_D$ is connected to the second electrode contacting pattern 112 of the sub-pixel. The second electrode connecting pattern 112 is electrically connected through the conductive spacer 114 to the second electrode (136 in FIG. 4) formed on the second substrate (130 in FIG. 4), that is, the upper substrate.

The organic electroluminescence device according embodiments of the present invention can prevent voltage drop along power lines used to apply power to each array element, thereby improving the uniformity of the entire picture quality on the panel. This can contribute to the improvement of the picture quality in a large-sized panel.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A organic electroluminescence device comprising:
First and second substrates spaced apart from each other by a predetermined distance;
a plurality of array elements formed on the first substrate;
organic electroluminescent diodes formed on the second substrate; and
conductive spacers for electrically connecting the array elements and corresponding organic electroluminescent diodes,
wherein the array elements are arranged on the first substrate in a matrix configuration, and power lines for supplying a voltages to the array elements are formed in a mesh configuration and electrically connected to each other,
wherein the power lines include:
a first power line arranged in parallel with the data line and spaced apart from the data line by a predetermined distance; and
a second power line arranged in parallel with the gate line and spaced apart from the gate line by another predetermined distance, the second power line intersecting the first power line.

2. The organic electroluminescence device according to claim 1, wherein each array element is within a sub-pixel defined by a gate line formed in a first direction and a data line formed in a second direction that crosses the first direction.

3. The organic electroluminescence device according to claim 1, wherein the first power line and the second power line are electrically connected at an intersection thereof a contact hole.

4. The organic electroluminescence device according to claim 1, wherein the second power line is formed of the same metal material and in the same layer as the data line.

5. The organic electroluminescence device according to claim 1, wherein the second power line is formed of the same metal material and in the same layer as the gate line.

6. The organic electroluminescence device according to claim 1, wherein the first or second power line is formed of a metal having a low resistance.

7. The organic electroluminescence device according to claim 6, wherein the metal having the low resistance is Cu.

8. An organic electroluminescence device comprising:
a first substrate having a plurality of array elements formed in a matrix configuration at regions defined by gate lines and data lines, the gate lines being arranged in a first direction, the data lines being formed arranged in a second direction intersecting with the first direction;

a second substrate on which organic electroluminescent diodes having organic electroluminescent layers are formed; and a conductive spacer for electrically connecting the array elements and corresponding organic electroluminescent diodes, wherein a first power line is arranged in parallel with the data lines and spaced apart from one of the data lines by a predetermined distance, and a second power line is arranged in parallel with the gate lines and spaced apart from one of the gate lines, the second power line intersecting with the first power line.

9. The organic electroluminescence device according to claim 8, wherein the first power line and the second power line are electrically connected at an intersection thereof through a contact hole.

10. The organic electroluminescence device according to claim 8, wherein the first power line is formed of the same metal material and in the same layer as the data lines.

11. The organic electroluminescence device according to claim 8, wherein the second power line is formed of the same metal material and in the same layer as the gate lines.

12. The organic electroluminescence device according to claim 8, wherein the first or second power line is formed of a metal having a low resistance.

13. The organic electroluminescence device according to claim 12, wherein the metal having the low resistance is Cu.

14. The organic electroluminescence device according to claim 8, further comprising:

a switching TFT formed at an intersection of the gate lines and the data lines;

a storage capacitor connected to the switching TFT and the first power line; and a driving TFT electrically connected to the storage capacitor, the first power line and one of the organic electroluminescent diodes.

15. A method of making an organic electroluminescence device comprising:

a forming a plurality of array elements on a first substrate in a matrix configuration defined by gate lines and data lines, the gate lines being arranged in a first direction, the data lines being arranged in a second direction intersecting with the first direction;

forming a first power line on the first substrate in parallel with the data lines and spaced apart from one of the data lines by a predetermined distance, and a second power line on the first substrate in parallel with the gate lines and spaced apart from one of the gate lines, the second power line intersecting with the first power line;

forming organic electroluminescent diodes on a second substrate; and providing a conductive spacer for electrically connecting the array elements and the corresponding organic electroluminescent diodes.

16. The method according to claim 15, wherein the first power line and the second power line are electrically connected at an intersection thereof through a contact hole.

17. The method according to claim 15, wherein the first power line is formed of the same metal material and in the same layer as the data lines.

18. The method according to claim 15, wherein the second power line is formed of the same metal material and in the same layer as the gate lines.

19. The method according to claim 15, wherein forming a plurality of array elements includes:

forming switching TFT formed at an intersection of the gate lines and the data lines;

forming a storage capacitor connected to the switching TFT and the first power line; and forming a driving TFT electrically connected to the storage capacitor, the first power line and one of the organic electroluminescent diodes.

* * * * *